US012568805B2

(12) United States Patent
Li et al.

(10) Patent No.: US 12,568,805 B2
(45) Date of Patent: Mar. 3, 2026

(54) SILICON WAFER AND METHOD FOR FILLING SILICON VIA THEREOF

(71) Applicant: Tencent Technology (Shenzhen) Company Limited, Guangdong (CN)

(72) Inventors: Dengfeng Li, Shenzhen (CN); Wenlong Zhang, Shenzhen (CN)

(73) Assignee: Tencent Technology (Shenzhen) Company Limited, Shenzhen (CN)

( * ) Notice: Subject to any disclaimer, the term of this patent is extended or adjusted under 35 U.S.C. 154(b) by 377 days.

(21) Appl. No.: 18/325,315

(22) Filed: May 30, 2023

(65) Prior Publication Data

US 2023/0307293 A1 Sep. 28, 2023

Related U.S. Application Data

(63) Continuation of application No. PCT/CN2022/127713, filed on Oct. 26, 2022.

(30) Foreign Application Priority Data

Dec. 17, 2021 (CN) .......................... 202111552686.1

(51) Int. Cl.
*H01L 21/768* (2006.01)
*H01L 23/48* (2006.01)
*H01L 23/532* (2006.01)

(52) U.S. Cl.
CPC .... *H01L 21/76882* (2013.01); *H01L 21/7684* (2013.01); *H01L 21/76898* (2013.01); *H01L 23/481* (2013.01); *H01L 23/53285* (2013.01)

(58) Field of Classification Search
CPC ........... H01L 21/76882; H01L 21/7684; H01L 21/76898; H01L 23/481; H01L 23/53285; H01L 21/76891; H10N 60/01
See application file for complete search history.

(56) References Cited

U.S. PATENT DOCUMENTS 8,377,565 B2 2/2013 Sekine et al.
2002/0086145 A1 7/2002 Yazaki et al.
(Continued)

FOREIGN PATENT DOCUMENTS

CN 1361655 A 7/2002
CN 102237325 A 11/2011
(Continued)

OTHER PUBLICATIONS

Chinese Office Action with English translation, Jul. 19, 2024, pp. 1-20, issued in Chinese Patent Application No. 202111552686.1, State Intellectual Property Office, Beijing, China.
(Continued)

*Primary Examiner* — Patricia D Valenzuela
(74) *Attorney, Agent, or Firm* — Crowell & Moring LLP

(57) ABSTRACT

Disclosed are a silicon wafer and a method for filling a silicon via thereof, and belong to the field of superconducting quantum technologies. The method includes: obtaining a silicon wafer including at least one silicon via; providing a superconducting material on at least one side of the silicon wafer, the at least one side comprising a side where an opening of the silicon via is located; and heating and pressurizing the superconducting material to fill the superconducting material into the silicon via.

19 Claims, 6 Drawing Sheets

(56)                    References Cited

U.S. PATENT DOCUMENTS

| | | | |
|---|---|---|---|
| 2003/0135997 A1* | 7/2003 | Watanabe | H01L 21/76898 |
| | | | 29/830 |
| 2010/0154211 A1 | 6/2010 | Uyama | |
| 2011/0219612 A1 | 9/2011 | Jacquet et al. | |
| 2012/0122266 A1 | 5/2012 | Sachs et al. | |
| 2013/0313687 A1 | 11/2013 | Bonkohara et al. | |
| 2015/0179913 A1* | 6/2015 | Pramanik | H01L 21/02266 |
| | | | 505/235 |
| 2019/0363128 A1 | 11/2019 | Rosenblatt et al. | |

FOREIGN PATENT DOCUMENTS

| | | | |
|---|---|---|---|
| CN | 102460657 A | 5/2012 |
| CN | 102593049 A | 7/2012 |
| CN | 110791746 A | 2/2020 |
| EP | 0 299163 A2 | 1/1989 |
| JP | 2003-133410 A | 5/2003 |
| JP | 2004-228135 A | 8/2004 |
| KR | 10-2012-0139267 A | 12/2012 |

OTHER PUBLICATIONS

Extended European Search Report issued in European Patent Application No. 22906079.3 dated May 14, 2025, 9 pages.
International Search Report and Written Opinion for priority application No. PCT/CN2022/127713 dated Jan. 10, 2023, 8p, in Chinese language.
Concise Explanation of Relevancy for A6.

* cited by examiner

Apply pressure

Pressurization device

20

01

00

10

Vacuum chamber

20

01

00

Vacuumize

10

Grinding and polishing

SILICON WAFER AND METHOD FOR FILLING SILICON VIA THEREOF

RELATED APPLICATION

This application is a continuation of International Patent Application No. PCT/CN2022/127713, filed on Oct. 26, 2022, which claims priority to Chinese Patent Application No. 202111552686.1, entitled "SILICON WAFER AND METHOD FOR FILLING SILICON VIA THEREOF" filed with China National Intellectual Property Administration on Dec. 17, 2021. The above applications are incorporated by reference in their entireties.

TECHNICAL FIELD

This application relates to the field of superconducting quantum technologies, and in particular, to a silicon wafer and a method for filling a silicon via thereof.

BACKGROUND

In the preparation of a three-dimensional quantum chip for superconducting quantum computing, a silicon via (such as a through-silicon via penetrating through a silicon wafer) is often formed on a silicon wafer, and a superconducting material is formed in the silicon via, which lays a good foundation for subsequent preparation.

In the related technology, a filling method, such as a physical vapor deposition (PVD) process, a chemical vapor deposition (CVD) process, and an atomic layer deposition (ALD) process, is generally adopted to fill the superconducting material in the silicon via.

However, due to the limitations of the process itself, the rate at which the superconducting material is filled in the silicon via by the current filling method is low. If a sufficiently thick superconducting material is to be filled in the silicon via, the filling time is long.

SUMMARY

Embodiments of this disclosure provide a silicon wafer and a method for filling a silicon via thereof, which can improve the filling rate of a superconducting material. The technical solutions will be described below.

In an aspect, a method for filling a silicon via is provided, which includes:

obtaining a silicon wafer including at least one silicon via;

providing a superconducting material on at least one side of the silicon wafer, the at least one side comprising a side where an opening of the silicon via is located; and heating and pressurizing the superconducting material to fill the superconducting material into the silicon via In another aspect, a silicon wafer is provided, which includes:

a silicon via, and superconducting material filled in the silicon via by the filling method according to the methods disclosed in the disclosure.

The technical solutions provided in the embodiments of this disclosure have at least the following beneficial effects.

A superconducting material is provided on at least one side, where an opening of a silicon via is located, of a silicon wafer, and is filled into the silicon via by a bonding method of heating and pressurization. By flexibly controlling the temperature and pressure, the superconducting material is melted and then quickly and sufficiently extruded into the silicon via to realize the filling of the superconducting material. The filling rate of the superconducting material by the filling method is high, and only a short time is needed to fill the sufficiently thick superconducting material.

Figure 1:
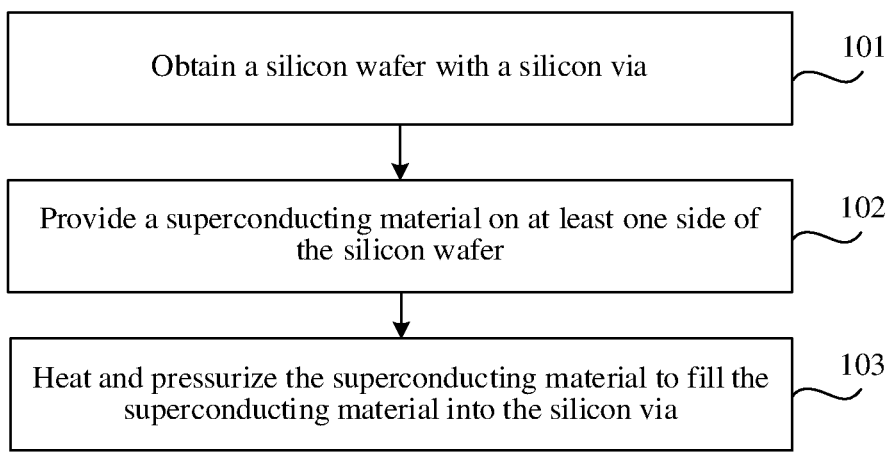
FIG. 1 is a flowchart of a method for filling a silicon via according to an embodiment of this disclosure.

Description of reference signs in the drawings:

00: silicon wafer, K0: silicon via, 01: superconducting material; and

10: heating table, and 20: hard spacer.

DESCRIPTION OF EMBODIMENTS

For ease of understanding, before the technical solutions in the embodiments of this disclosure are described, terms involved in the embodiments of this disclosure are described below first.

PVD process: it refers to a technique in which a material to be deposited on a substrate (such as a silicon wafer) is physically vaporizes into gaseous atoms or molecules, and then a thin film is formed on the surface of the substrate.

CVD process: it refers to a technique in which a plurality of gas components chemically react on the surface of a substrate and then are attached to the substrate to form a thin film.

ALD process: it refers to a technique in which substances are plated on the surface of a substrate layer by layer in the form of a monoatomic film.

Silicon via: it refers to a via formed by etching a silicon wafer by a deep silicon etching process. The silicon via typically includes a through-silicon via or a silicon blind via. The through-silicon via refers to a through via penetrating through the silicon wafer obtained by etching through a silicon wafer. The silicon blind via refers to a silicon blind via obtained by not etching through a silicon wafer.

Interposer: it refers to a silicon wafer with a through-silicon via filled with a conducting material. In the process of stacking several chips one by one, multiple chips of different layers above and below may be interconnected through the interposer to achieve three-dimensional integration of chips with different functions. In addition, in a silicon wafer with a silicon blind via, a conducting material also needs to be filled in the silicon blind via so as to lay a foundation for subsequent processing processes. For example, in the subsequent processing processes, after the conducting material is filled in the silicon blind via, the silicon blind via may be treated to be a through-silicon via so as to interconnect a plurality of chips. Furthermore, it has been tested that to ensure a reliable connection of multiple chips, it is necessary to fill the silicon via with a sufficiently thick conducting material. For example, it is generally necessary to completely fill the silicon via until no voids in the silicon via.

Exemplarily, the conducting material filled in the silicon via may be classified into a superconducting material and a non-superconducting material. Common non-superconducting materials include copper; and common superconducting materials include aluminum, niobium, tantalum, titanium nitride, and the like.

In the related technology, a Damascene process is commonly used in the semiconductor technology to fill a copper material into a silicon via. That is, a diffusion impervious layer and a seed layer are first deposited in the silicon via by the PVD process, and then copper is filled in the silicon via by an electroplating process. However, copper does not have superconductivity, so it cannot be applied to a three-dimensional quantum chip (that is, a superconducting quantum chip) of a currently popular superconducting quantum computer. For this reason, in the related technology, a superconducting material is generally filled in a silicon via by the PVD process, the CVD process or the ALD process to prepare a superconducting quantum chip.

However, when a superconducting material is filled by the PVD process, because a deposition direction is basically perpendicular to a bearing surface of a silicon wafer, continuous thin films cannot be deposited in a silicon via, the deposition thickness may fail the requirements, and the step coverage is not perfect. When a superconducting material is filled by the CVD process or the ALD process, because it is preferred to precisely control a stoichiometric ratio of different elements in the material (such as nitrogen elements and titanium elements in a titanium nitride material), and to minimize impurities in the material, the filling rate is low and the coating time is long if a sufficiently thick superconducting material is to be filled. In view of the time cost, a current superconducting material filled by the CVD process or the ALD process typically has a thickness of about 100 nanometers (nm) to 200 nm, and therefore a silicon via cannot be filled with a satisfactory completeness. This not only brings difficulties to subsequent processing (such as forming a circuit pattern on the surface of a silicon wafer), but also leads to ineffective connections between stacked chips, which in turn leads to poor reliability of signal transmission between the chips.

The embodiments of this disclosure provide a method for filling a silicon via, and according to the method, the speed of filling a superconducting material in a silicon via can be increased, so that a sufficiently thick superconducting material can be filled in the silicon via in a relatively short period of time; thus, it can reduce the difficulty of subsequent processing and ensure good reliability of signal transmission between chips. In addition, a silicon wafer of which a silicon via is filled by the method may be used for the preparation of a superconducting quantum chip. FIG. 1 is a flowchart of a method for filling a silicon via according to an embodiment of this disclosure. As shown in FIG. 1, the method includes the following steps.

Step 101: Obtain a silicon wafer with a silicon via.

Exemplarily, the silicon via is a through-silicon via obtained by etching through a silicon wafer by a deep silicon etching process, or the silicon via is a silicon blind via that does not penetrate through the silicon wafer and is obtained by partially etching the silicon wafer by a deep silicon etching process.

Step 102: Provide a superconducting material on at least one side of the silicon wafer.

The at least one side includes a side where an opening of the silicon via is located. That is, after the silicon wafer with the silicon via is obtained, the superconducting material is provided on the side, where the opening of the silicon via is located, of the silicon wafer.

Step 103: Heat and pressurize the superconducting material to fill the superconducting material into the silicon via.

After the superconducting material is provided, the superconducting material may be heated and pressurized, so that the superconducting material is effectively and sufficiently filled into the silicon via. The heat treatment and the pressure treatment may be collectively referred to as: the bonding treatment.

Exemplarily, the superconducting material is first heated and then pressurized; alternatively, the superconducting material is first pressurized and then heated; alternatively, the superconducting material is pressurized and heated synchronously, which is not limited herein.

Based on the above, a method for filling a silicon via is disclosed herein. The method includes: a superconducting material is provided on a side, where an opening of a silicon via is located, of a silicon wafer, and is filled into the silicon via by a bonding method of heating and pressurization. By this method, by flexibly controlling the temperature and pressure, the superconducting material is melted and then quickly and sufficiently extruded into the silicon via to realize the filling of the superconducting material. The filling rate of the superconducting material in the silicon via by the filling method is high, and only a short time is needed to fill the sufficiently thick superconducting material. On the premise of filling the sufficiently thick superconducting material, the method can reduce the difficulty of subsequent processes, enable effective connections between chips, and ensure good reliability of signal transmission between the chips.

Figure 2:
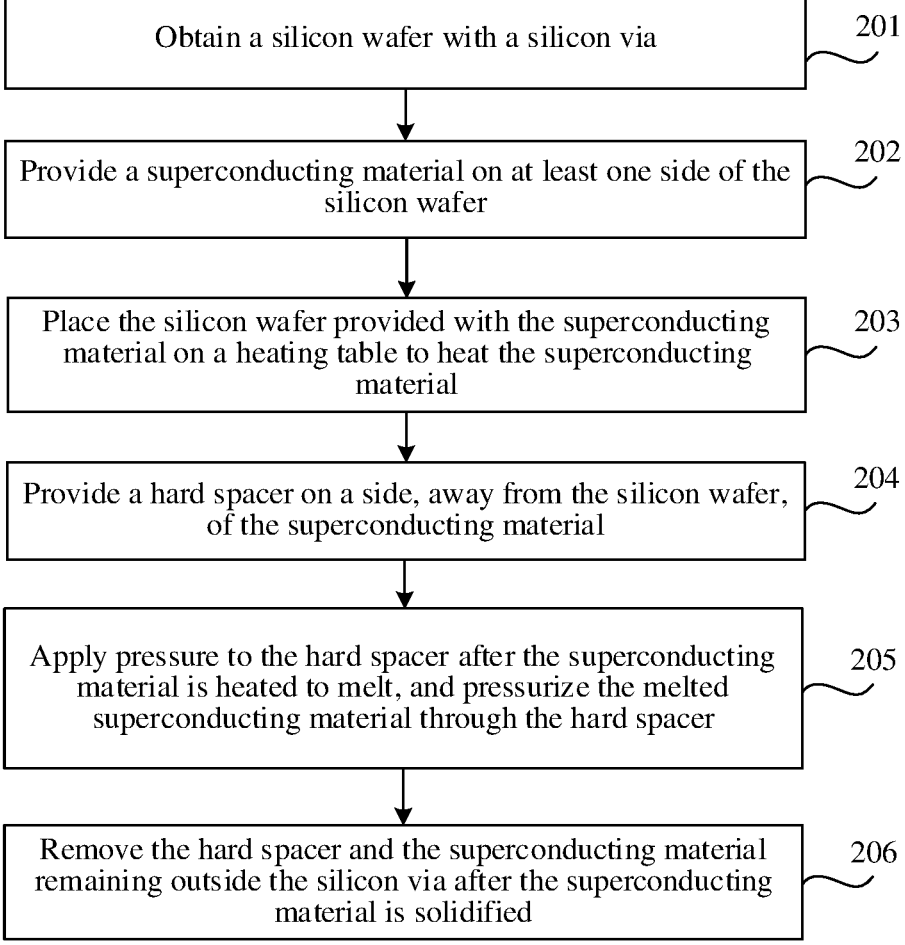
FIG. 2 is a flowchart of another method for filling a silicon via according to an embodiment of this disclosure.

FIG. 2 is a flowchart of another method for filling a silicon via according to an embodiment of this disclosure. As shown in FIG. 2, the method may include the following steps.

Step 201: Obtain a silicon wafer with a silicon via.

Exemplarily, the silicon via is a through-silicon via obtained by etching through a silicon wafer by a deep silicon etching process, or the silicon via is a silicon blind via that does not penetrate through the silicon wafer and is obtained by partially etching the silicon wafer by a deep silicon etching process.

Figure 3:
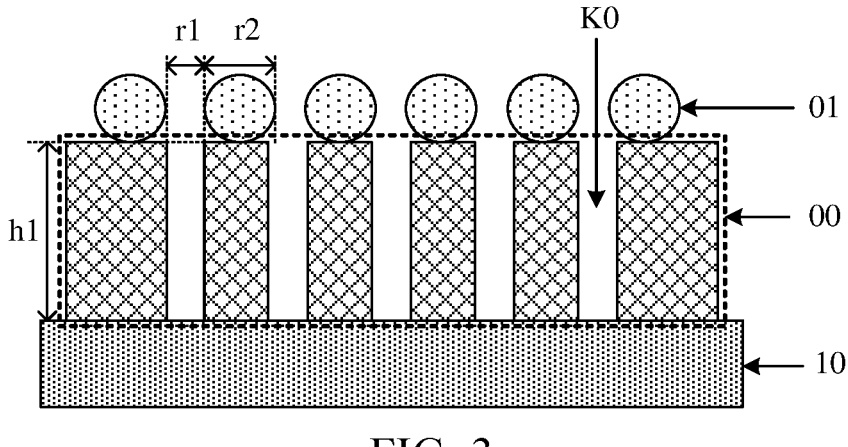
FIG. 3 is a cross sectional view of a structure including a silicon wafer, a superconducting material, and a heating table according to an embodiment of this disclosure.
Figure 4:
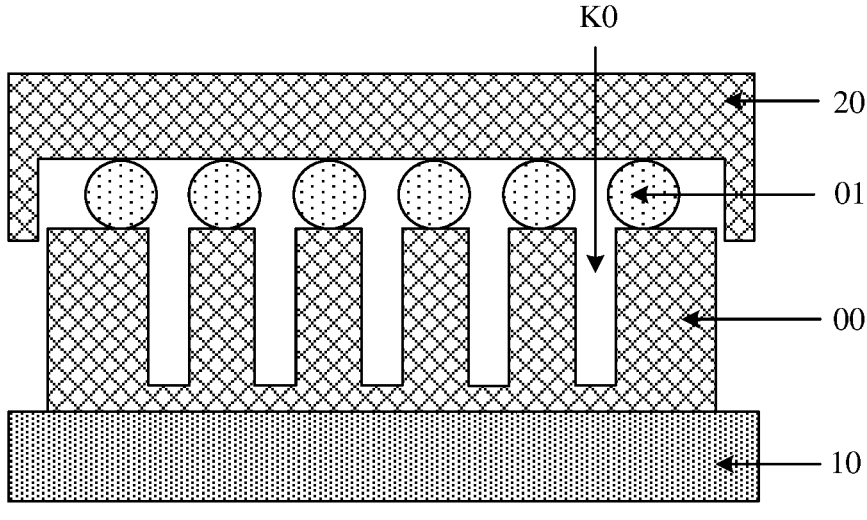
FIG. 4 is a cross sectional view of a structure including a silicon wafer, a superconducting material, a heating table, and a hard spacer according to an embodiment of this disclosure.

Exemplarily, a case where the silicon via is a through-silicon via is taken as an example. FIG. 3 shows a cross sectional view of a silicon wafer 00. It can be seen from FIG. 3 that a silicon via K0 on the silicon wafer 00 penetrates through the silicon wafer 00, and accordingly, the silicon via K0 may be referred to as a through-silicon via. A case where the silicon via is a silicon blind via is taken as an example. FIG. 4 shows a cross sectional view of another silicon wafer 00, and it can be seen from FIG. 4 that the silicon via K0 on the silicon wafer 00 does not penetrate through the silicon wafer 00. Accordingly, the silicon via K0 may be referred to as a silicon blind via.

Exemplarily, for the silicon via, referring to FIG. 3 or FIG. 4, a via diameter r1 of an opening of the silicon via K0 may be about 30 micrometres (μm) to 50 μm, such as 40 μm. In general, an inner wall of the silicon via K0 is almost or substantially vertical, so it can also be considered that a via diameter of the silicon via K0 as a whole is about 30 μm to 50 μm. For a through-silicon via, referring to FIG. 3, a depth hl of the through-silicon via may be about 200 μm. In other words, a thickness of the silicon wafer 00 with the through-silicon via may be about 200 μm.

It can be seen from FIG. 3 and FIG. 4 that one silicon wafer 00 may have a plurality of silicon vias K0, and the silicon vias K0 may be arranged at equal intervals. Of course, in some embodiments, the plurality of silicon vias K0 may be arranged at non-equal intervals. Or, one silicon wafer 00 may have only one silicon via K0.

In addition, the silicon vias K0 on one silicon wafer 00 may all be through-silicon vias; alternatively the silicon vias K0 on one silicon wafer 00 may all be silicon blind vias; alternatively the silicon vias K0 on one silicon wafer 00 may be partly through-silicon vias and partly silicon blind vias.

Step 202: Provide a superconducting material on at least one side of the silicon wafer.

The at least one side includes a side where an opening of the silicon via is located. That is, in the embodiments of this disclosure, after the silicon wafer with the silicon via is obtained, the superconducting material may be provided on the side, where the opening of the silicon via is located, of the silicon wafer.

Figure 5:
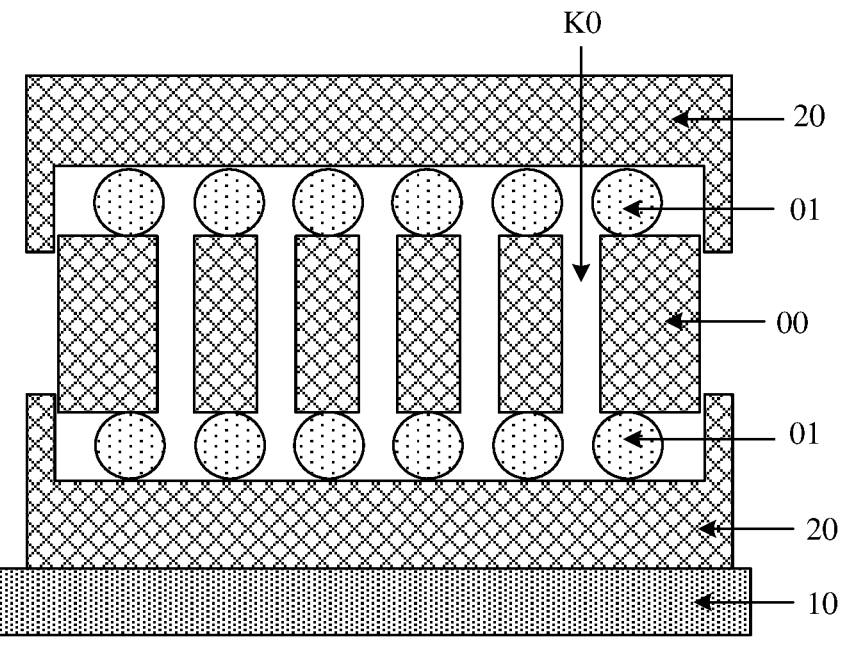
FIG. 5 is a cross sectional view of another structure including a silicon wafer, a superconducting material, a heating table, and a hard spacer according to an embodiment of this disclosure.

For example, referring to FIG. 3, in a case that the silicon via K0 of the silicon wafer 00 is a through-silicon via, the through-silicon via of the silicon wafer 00 may have two openings, which may also be referred to as through via openings. A superconducting material 01 may be provided on a side where one of the openings is located. Referring to FIG. 5, the superconducting material 01 may be provided on both sides where upper and lower openings are located. Referring to FIG. 4, in a case that the silicon via K0 of the silicon wafer 00 is a silicon blind via, the silicon blind via of the silicon wafer 00 has only one opening, and the superconducting material 01 may be provided on the side where the opening is located.

Exemplarily, referring to FIG. 3 to FIG. 5, in the embodiments of this disclosure, the superconducting material 01 is in a granular form, and a diameter of the superconducting material 01 is greater than a via diameter of the silicon via K0.

Exemplarily, referring to FIG. 3, in the embodiments of this disclosure, the superconducting material 01 may have a diameter r2 of about a few millimeters (mm), such as 3 mm. According to the foregoing description of the via diameter r1 of the silicon via K0, it can be seen that the diameter r2 of the superconducting material 01 is much greater than the via diameter r1 of the silicon via K0. Furthermore, the super-conducting material 01 includes: indium or tin. Both indium and tin are typically spherical particles with a diameter of about a few millimeters.

Filling effects of an indium material and a tin material are better than that of a titanium nitride material, thereby ensuring better connection of subsequent circuits and reducing the difficulty of subsequent other processing processes. In addition, if an indium material is used as a superconducting material for filling, an indium column may be prepared directly on a silicon via in the subsequent process, which is well combined with a flip-chip bonding process based on an indium column in a superconducting quantum chip, so that the wiring space can be saved and the integration degree of qubits in the superconducting quantum chip can be increased.

Exemplarily, the superconducting material 01 is contained in a container (such as a glass bottle), and when the superconducting material 01 is taken out of the container for use, the superconducting material 01 may be poured out of the container and uniformly spread on the silicon wafer 00 with the silicon via K0. Reliable and effective filling of each of the plurality of silicon vias K0 of the silicon wafer 00 can be ensured by the uniform spreading.

Step 203: Place the silicon wafer provided with the superconducting material on a heating table to heat the superconducting material.

Exemplarily, in the embodiments of this disclosure, the silicon wafer 00 is fixed to the heating table by electrostatic adsorption. In this way, it is possible to prevent the movement of the silicon wafer 00 during the subsequent operation and improve the filling effect of the superconducting material 01. Of course, in some embodiments, the silicon wafer 00 provided with the superconducting material 01 may be fixed to the heating table in other ways, such as fixing with a baffle. Alternatively, the silicon wafer 00 may be placed directly on the heating table horizontally. In addition, the silicon wafer 00 may be automatically placed on the heating table by an automation device similar to a mechanical arm, or the silicon wafer 00 may be manually placed on the heating table.

When the silicon wafer 00 is fixed on the heating table, the silicon wafer 00 provided with the superconducting material 01 may be fixed on the heating table, or the silicon wafer 00 may be fixed on the heating table first, and then the superconducting material 01 may be provided on at least one side of the silicon wafer 00.

Exemplarily, FIG. 3 to FIG. 5 also respectively show a heating table 10. The heating table 10 may be provided with a resistance wire for heating, that is, the heating table 10 may heat the superconducting material 01 by a resistance wire heating method. The surface of the heating table 10 may be provided with a display screen and a temperature control component configured to set temperature, and the display screen may display the temperature and/or the heating duration, such that accurate feedback control of the heating temperature is achieved. Of course, in some embodiments, the superconducting material 01 may be heated in other ways. For example, the superconducting material 01 may be irradiated with a heating filament to heat the superconducting material 01.

Exemplarily, a case where the superconducting material 01 is heated through the heating table is taken as an example, if the superconducting material 01 is an indium material, because the melting point of the indium material is about 156 degrees Celsius (° C.), the heating temperature of the heating table may be controlled to be higher than 156° C. Furthermore, the temperature of the heating table may further be controlled to be lower than 160° C., so that it is possible to effectively prevent oxidation of the indium material due to excessive temperature while ensuring reliable melting of the indium material. If the superconducting material 01 is a tin material, because the melting point of the tin material is about 232° C., the heating temperature of the heating table may be controlled to be slightly higher than 232° C., such as higher than 232° C. and lower than 235° C. In this way, it is possible to effectively prevent oxidation of the tin material due to excessive temperature while ensuring reliable melting of the tin material.

In the embodiments of this disclosure, the silicon wafer 00 with the silicon via K0 is placed on the heating table first, and then the superconducting material 01 is provided on at least one side of the silicon wafer 00. In this way, with respect to a case where the superconducting material 01 is provided on a side of the silicon wafer 00 first and then the silicon wafer 00 provided with the superconducting material 01 is placed on the heating table, it is possible to prevent the superconducting material 01 from falling off in the process of moving the silicon wafer 00 to the heating table.

Step 204: Provide a hard spacer on a side, away from the silicon wafer, of the superconducting material.

Figure 6:
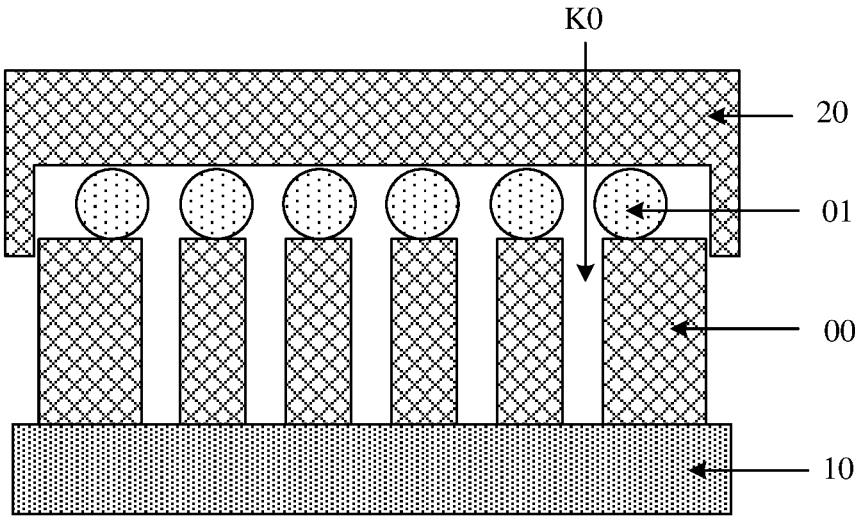
FIG. 6 is a cross sectional view of still another structure including a silicon wafer, a superconducting material, a heating table, and a hard spacer according to an embodiment of this disclosure.

Exemplarily, the hard spacer may be a glass sheet or a silicon wafer, and the following embodiments of this disclosure will be described by taking a case where the hard spacer is a silicon wafer as an example. FIG. 4 and FIG. 5 also respectively show a hard spacer 20 provided on the side, away from the silicon wafer, of the superconducting material. A structure shown in FIG. 3 is taken as an example, FIG. 6 shows a schematic diagram of a structure provided with the hard spacer 20. It can be seen through comparison of FIG. 4 to FIG. 6 that for a scene where the superconducting material 01 is provided on only one side, only one hard spacer 20 may be accordingly provided; and for a scene where the superconducting material 01 is provided on both sides, a hard spacer 20 is accordingly respectively provided for the superconducting material 01 on both sides.

Exemplarily, similar to the placement of the silicon wafer on the heating table, the hard spacer may be automatically placed on the side, away from the silicon wafer, of the superconducting material by an automation device similar to a mechanical arm, or the hard spacer may be manually placed on the side, away from the silicon wafer, of the superconducting material.

Step 205: Apply pressure to the hard spacer after the superconducting material is heated to melt, and pressurize the melted superconducting material through the hard spacer.

Figure 7:
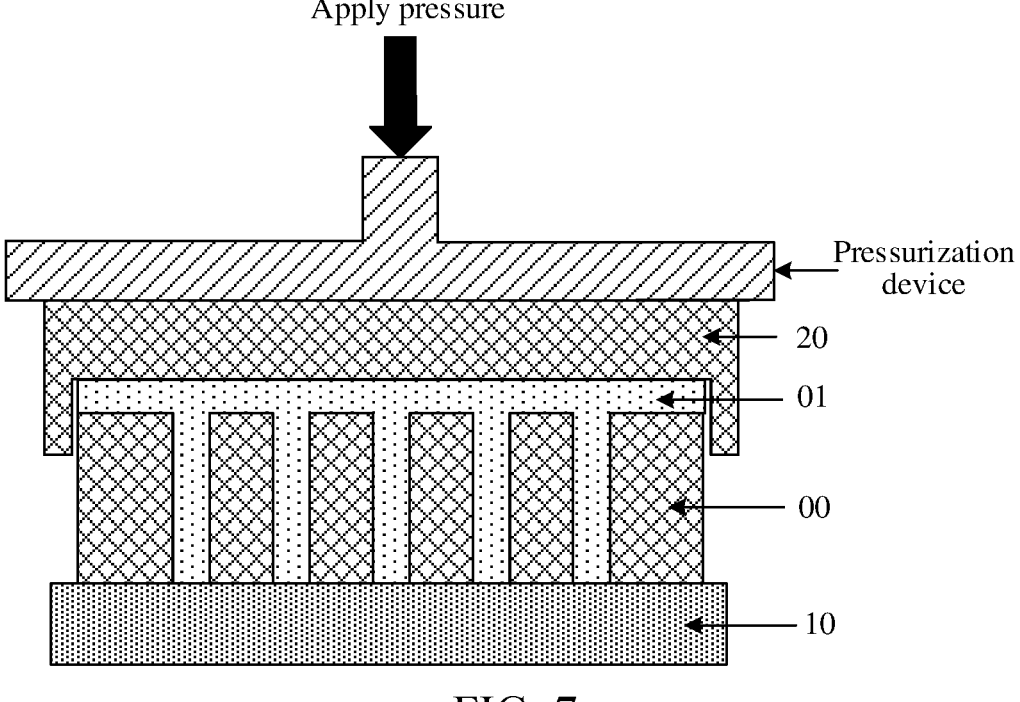
FIG. 7 is a cross sectional view of a structure including a silicon wafer, a superconducting material, a heating table, a hard spacer, and a pressurization device according to an embodiment of this disclosure.

Exemplarily, referring to FIG. 7, in the embodiments of the present disclosure, a pressurization device may be provided on a side, away from the superconducting material 01, of the hard spacer 20, and after the superconducting material 01 is heated to melt, pressure is applied to the hard spacer 20 through the pressurization device, so that the melted superconducting material 01 is indirectly pressurized, and the melted superconducting material 01 is sufficiently filled into the silicon via K0. The operation of applying pressure in FIG. 7 may be performed manually or may be performed automatically by a mechanical device.

Based on this, it can be seen from FIG. 4 to FIG. 7 that the hard spacer 20 used in the embodiments of this disclosure covers the superconducting material 01, so that it is possible to reduce overflowing of the melted superconducting material 01 in the process of pressurizing the melted superconducting material 01, and it is ensured that the superconducting material 01 is sufficiently filled into the silicon via K0. That is, not only the superconducting material 01 can be saved, but also the filling effect of the superconducting material 01 can be improved. Of course, in other embodiments, the hard spacer 20 may cover only the superconducting material 01.

Exemplarily, it can be seen from FIG. 4 to FIG. 7 that the hard spacer 20 according to the embodiments of this disclosure may be machined to be concave, and the area of a concave region may be slightly larger than the area of the silicon wafer 00. The superconducting material 01 may be encapsulated in a groove of the concave hard spacer 20. That is, the concave hard spacer 20 may be buckled on the superconducting material 01 to cover the superconducting material 01.

With regard to the embodiment shown in FIG. 5, by providing the superconducting material 01 and the hard spacer 20 on both sides where the two through via openings of the through-silicon via are located (that is, two surfaces of the silicon wafer 00), the superconducting material 01 on both sides may be filled into the through-silicon via at the same time by a simultaneous heating and pressurization treatment. That is, the through-silicon via can be simultaneously filled with the superconducting material 01 on both surfaces. In this way, not only the filling rate can be increased, but also the filling effect can be improved. In addition, referring to FIG. 5, in addition to the two provided hard spacers 20, two heating tables 10 may be provided, which are respectively provided on a side of each of the two hard spacers 20 to heat the superconducting material 01 on both sides at the same time. In this way, the heating rate can be increased to further increase the filling rate.

Exemplarily, with reference to the foregoing description of step 203, whether the superconducting material is melted may be determined according to the current heating temperature. After the heating temperature rises to certain temperature, it is determined that the superconducting material is melted and further pressure is applied to the hard spacer. Alternatively or additionally, it is also possible to determine whether the superconducting material is melted by setting the heating duration. That is, after the heating duration reaches certain duration, it is determined that the superconducting material is melted and further pressure is applied to the hard spacer. If the foregoing pressurization operation is performed manually, it is possible for a user to determine when to apply pressure based on the heating temperature or the heating duration. If the foregoing pressurization operation is automatically performed by a mechanical device, the pressurization device and the heating table may be arranged to cooperate to achieve precise control of the temperature and pressure.

For example, the superconducting material may be heated directly by using a purchased wafer bonding device, and pressure is automatically applied to the hard spacer by using a mechanical device. That is, both a heat treatment device such as the heating table and a pressurization treatment device such as the pressurization device may be structures integrated in a wafer bonding device, and the foregoing heat and pressurization treatment, that is, the bonding treatment, is automatically performed directly on the superconducting material by using the wafer bonding device. It has been tested that accurate and uniform control of temperature and pressure can be achieved by using a current mature wafer bonding device with equipment with an alignment system. Furthermore, a better filling effect of the superconducting material can be further ensured.

In the embodiments of this disclosure, a silicon wafer with a silicon via may be placed on a heating table first, then a superconducting material is provided on a side where the silicon via is located. Further, a hard spacer is provided on a side of the superconducting material, and the superconducting material is successively heated and pressurized. In addition, the order of the heating treatment and the pressurization treatment is not limited to that described in the foregoing embodiments. For example, the superconducting material may be further pressurized by applying pressure to the hard spacer while the superconducting material is heated.

Exemplarily, the superconducting material may be directly heated and pressurized under atmospheric pressure, or the superconducting material may be heated and pressurized in a vacuum environment. It has been tested that the heating and pressurization of the superconducting material in a vacuum environment may prevent formation of bubbles in the silicon via during filling of the superconducting material or in the melted superconducting material. Accordingly, voids of the superconducting material filled into the silicon via can be reduced to ensure that the superconducting material is sufficiently filled into the silicon via. Furthermore, the method of heating and pressurizing the superconducting material in a vacuum environment is particularly suitable for the silicon blind via scene shown in FIG. 4.

Figure 8:
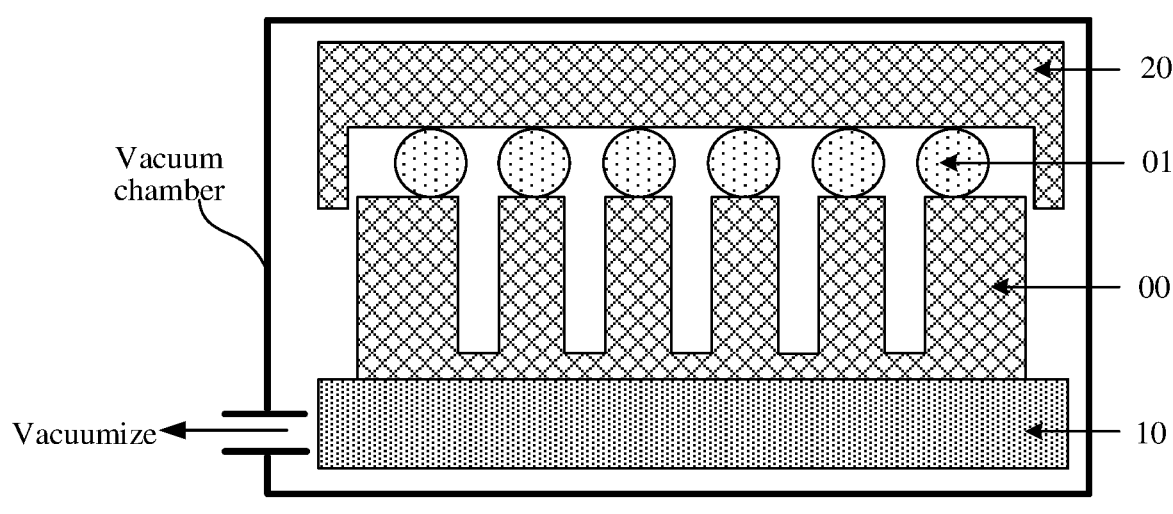
FIG. 8 is a schematic diagram of placing the structure shown in FIG. 4 in a vacuum chamber according to an embodiment of this disclosure.
Figure 9:
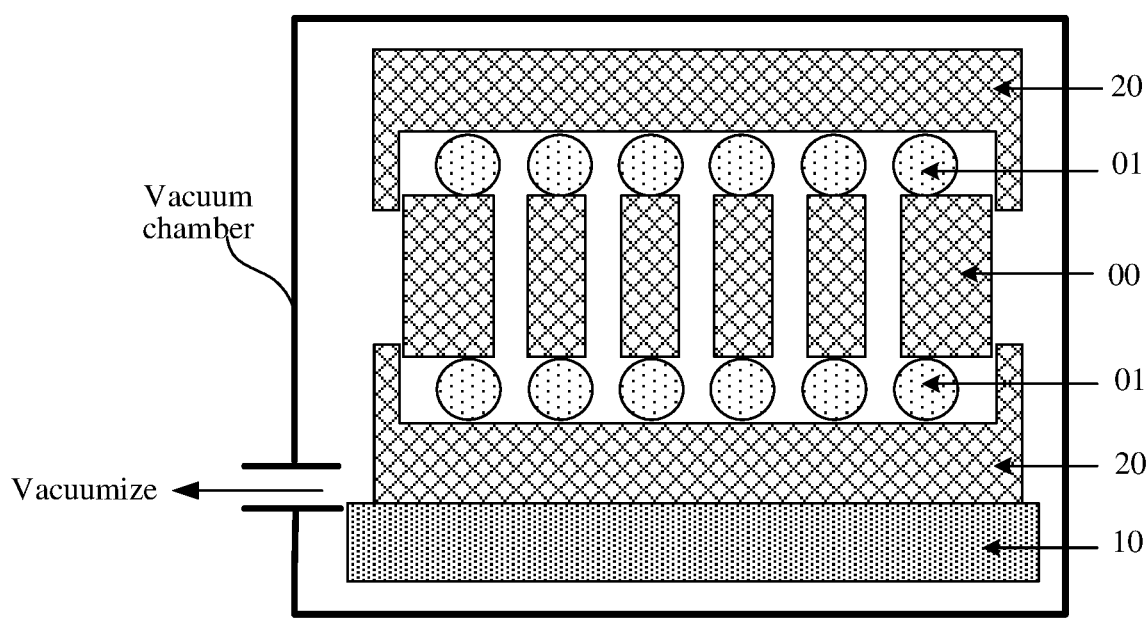
FIG. 9 is a schematic diagram of placing the structure shown in FIG. 5 in a vacuum chamber according to an embodiment of this disclosure.

Exemplarily, referring to FIG. 8, the entire structure shown in FIG. 4 may be placed in a vacuum chamber, which may be vacuumed before the heat treatment and the pressurization treatment. Then, the superconducting material is heated and pressurized to effectively discharge bubbles of the superconducting material filled into the silicon via and bubbles in the silicon via. In addition, FIG. 9 is a schematic structural diagram of placing the entire structure shown in FIG. 5 in the vacuum chamber.

Exemplarily, in the structure placed in the vacuum chamber, the heating table and the pressurization device for applying pressure to the hard spacer may be in communication connection in a wired or wireless manner with a processing device (such as a computer) outside the vacuum chamber, and the heat treatment and the pressurization treatment may be controlled through the processing device.

Figure 10:
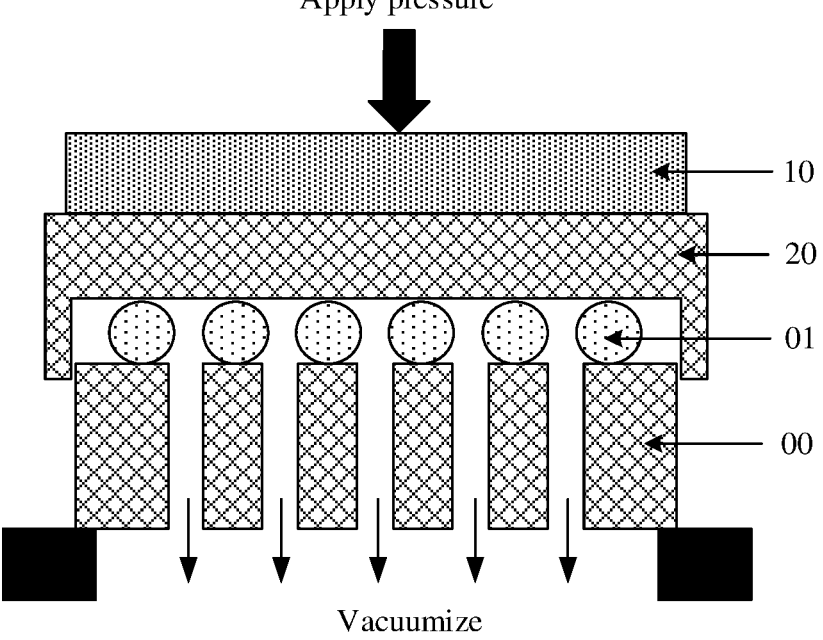
FIG. 10 is a cross sectional view of yet another structure including a silicon wafer, a superconducting material, a heating table, and a hard spacer according to an embodiment of this disclosure.

Exemplarily, in a case where the superconducting material is on only one side of the silicon wafer, as shown in FIG. 4 or FIG. 6, the heating table 10 is located on the side, away from the silicon wafer 00, of the superconducting material 01. That is, the heating table 10 and the hard spacer 20 may be respectively located on different sides, which may also be referred to as opposite sides, of the silicon wafer 00. Or, as shown in FIG. 10, the heating table 10 may be located on a side, away from the superconducting material 01, of the silicon wafer 00. That is, the heating table 10 and the hard spacer 20 may be located on the same side of the silicon wafer 00, and are sequentially stacked in a direction close to the silicon wafer 00. Of course, in some other embodiments, the heating table 10 and the hard spacer 20 may be sequentially stacked in a direction away from the silicon wafer 00.

On the basis of the structure shown in FIG. 10, it can be seen from FIG. 10 that in a case that the silicon via K0 is a through-silicon via penetrating through the silicon wafer 00, after the superconducting material 01 is provided on at least one side of the silicon wafer 00, the through-silicon via on a side, where the superconducting material 01 is not provided, of the silicon wafer 00 may be vacuumed. In this way, the melted superconducting material can be sucked into the through-silicon via better and faster through a negative pressure state in the through-silicon via, and on the other hand, the purpose of saving the superconducting material can also be achieved. Exemplarily, the through-silicon vias may be vacuumed by using a vacuum extractor such as a vacuum pump.

Referring to FIG. 10, the heating table 10, the hard spacer 20, and the superconducting material 01 may be located on an upper surface of the silicon wafer 00, so that the through-silicon via may be vacuumed from the bottom to increase the filling rate. Of course, in some other embodiments, the heating table 10, the hard spacer 20, and the superconducting material 01 may also be located on a lower surface of the silicon wafer 00, and accordingly, the through-silicon via may be vacuumed from the top.

The superconducting material is filled in the silicon via by the combination of bonding treatment and vacuum-assisted way, the effective filling of the superconducting material can be achieved, and a good filling effect is ensured.

Step 206: Remove the hard spacer and the superconducting material remaining outside the silicon via after the superconducting material is solidified.

Exemplarily, in the embodiments of this disclosure, after the superconducting material is solidified, the hard spacer and the superconducting material remaining outside the silicon via (that is, the surface of the silicon wafer) may be removed by a grinding and polishing process, so as to obtain the silicon wafer completely filled with the superconducting material. Then, subsequent processing processes may be performed. For example, a desired circuit pattern is formed on the surface of the silicon wafer. It is necessary to remove pressure applied to the hard spacer before grinding and polishing.

Figure 11:
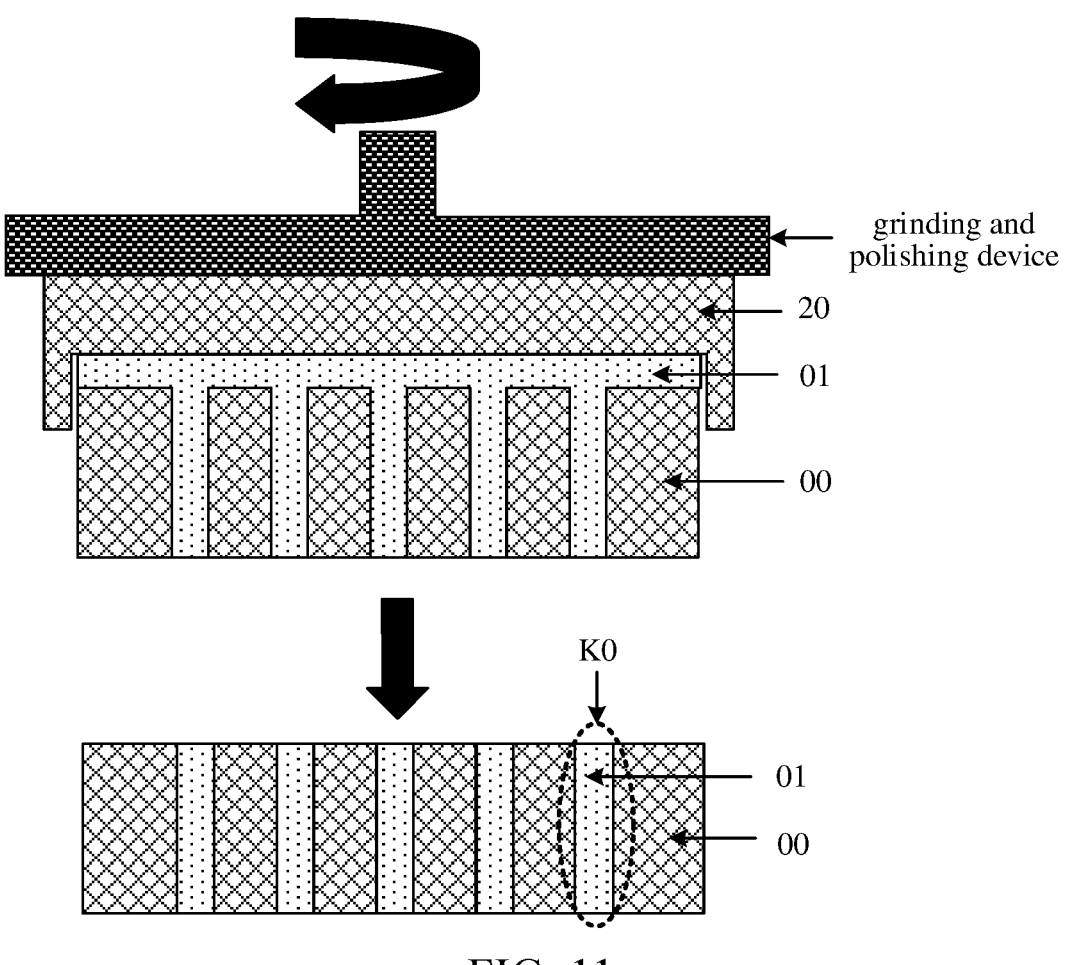
FIG. 11 is a cross sectional view of a structure including a silicon wafer, a superconducting material, a heating table, a hard spacer, and a grinding and polishing device according to an embodiment of this disclosure.

For example, referring to FIG. 11, a grinding and polishing device may be provided, and the hard spacer 20 and the superconducting material 01 remaining outside the silicon via K0 may be sequentially ground and polished by using the grinding and polishing device. FIG. 11 also shows a structure of the ground and polished silicon wafer 00 filled with the superconducting material 01, and the finally obtained silicon wafer 00 needs to be a structure with a flat surface, which can be used as an interposer of three-dimensional superconducting quantum chips to reliably interconnect the stacked superconducting quantum chips.

Exemplarily, the superconducting material may be solidified by slow cooling. Accordingly, whether the superconducting material is solidified may be determined according to the current temperature. That is, after the heating temperature is lowered to certain temperature, it is determined that the superconducting material is solidified. Alternatively or additionally, it is also possible to determine whether the superconducting material is solidified by setting the cooling duration. That is, after the cooling duration reaches certain duration, it is determined that the superconducting material is solidified. Because the superconducting material in the silicon via and the superconducting material remaining outside the silicon via will firmly stick the hard spacer and the silicon wafer together after the superconducting material is solidified, it is preferred to grind and polish the hard spacer by using a grinding and polishing process. The cooling operation may be performed manually. For example, a user sets the heating table to lower the temperature. Alternatively or additionally, the cooling operation may be performed automatically by a device. For example, the heating table automatically lowers the temperature.

The order of the steps of the method for filling a silicon via according to the embodiments of this disclosure may be appropriately adjusted. For example, step 204 may be performed before step 203, that is, the hard spacer may be placed first, and then the superconducting material is heated.

Any variation readily figured out by those skilled in the art within the technical scope disclosed in this disclosure shall fall within the scope of protection of this disclosure.

Based on the above, a method for filling a silicon via is disclosed herein. The method includes: a superconducting material is provided on a side, where an opening of a silicon via is located, of a silicon wafer, and is filled into the silicon via by a bonding method of heating and pressurization. By this method, by flexibly controlling the temperature and pressure, the superconducting material is melted and then quickly and sufficiently extruded into the silicon via to realize the filling of the superconducting material. The filling rate of the superconducting material in the silicon via by the filling method is high, and only a short time is needed to fill the sufficiently thick superconducting material. On the premise of filling the sufficiently thick superconducting material, the method can reduce the difficulty of subsequent processes, enable effective connections between chips, and ensure good reliability of signal transmission between the chips.

Figure 12:
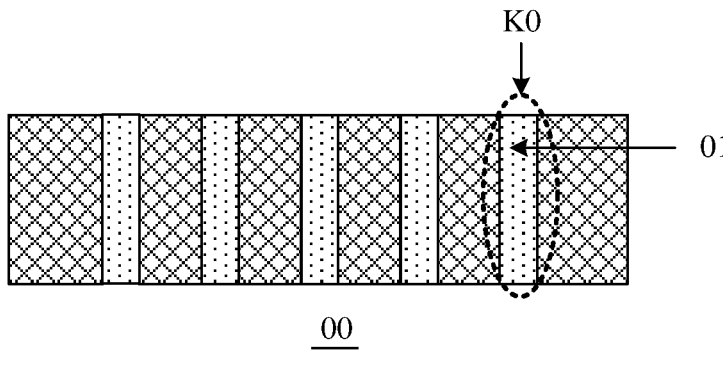
FIG. 12 is a cross sectional view of a silicon wafer according to an embodiment of this disclosure.

FIG. 12 is a schematic structural diagram of a silicon wafer according to an embodiment of this disclosure. As shown in FIG. 12, a silicon wafer 00 includes: a silicon via K0, and a superconducting material 01 filled in the silicon via K0.

A method for filling the superconducting material 01 is the filling method shown in FIG. 2 or FIG. 3. Based on the foregoing embodiments, it can be known that the superconducting material filled by the filling method can be thicker, and the filling effect is better.

Exemplarily, "one", "a", and similar terms used in the embodiments of this disclosure do not indicate a quantity limitation, but indicates that there is at least one.

Similarly, "include", "contain", and similar terms mean that elements or items appearing before the terms cover elements or items listed after the terms and their equivalents, but do not exclude other elements or items.

The terms "upper", "lower", "left", "right", and the like are used only to indicate relative positional relationships that may change accordingly when an absolute position of a described object changes.

"And/or" means that there may be three relationships. For example, A and/or B, which means: only A exists, both A and B exist, and only B exists. The symbol "I" generally indicates an "or" relationship between contextual objects.

What is claimed is:

1. A method for filling a silicon via, comprising:
obtaining a silicon wafer including at least one silicon via;
providing a superconducting material on at least one side of the silicon wafer, the at least one side comprising a side where an opening of the silicon via is located, the superconducting material being in a granular form with diameters of particles of the superconducting material being greater than a via diameter of the silicon via; and
heating and pressurizing the superconducting material to fill the superconducting material into the silicon via.

2. The method according to claim 1, wherein the heating and pressurizing the superconducting material comprises:
heat the superconducting material with a heating table;
providing a spacer on a side, opposite to the silicon wafer, of the superconducting material; and
applying pressure to the spacer after the superconducting material is heated to melt, and pressurizing the melted superconducting material through the spacer.

3. The method according to claim 2, further comprising:
maintaining the silicon wafer on the heating table by electrostatic adsorption.

4. The method according to claim 2, wherein providing the spacer comprising covering the superconducting material with the spacer.

5. The method according to claim 2, after applying pressure to the spacer and pressurizing the melted superconducting material through the spacer, further comprising:
removing the spacer and superconducting material remaining outside the silicon via after the superconducting material remaining outside the silicon via is solidified.

6. The method according to claim 5, wherein removing the spacer and the superconducting material remaining outside the silicon via comprises:
removing the spacer and the superconducting material remaining outside the silicon via by a grinding and polishing process.

7. The method according to claim 2, further comprising:
situating the silicon wafer, such that the heating table is located on a same side of the silicon wafer with the superconducting material.

8. The method according to claim 7, wherein the silicon via is a through-silicon via penetrating through the silicon wafer, after the providing a superconducting material on at least one side of the silicon wafer, the method further comprises:
vacuuming the through-silicon via on a side of the silicon wafer opposite to the superconducting material.

9. The method according to claim 2, further comprising:
situating the silicon wafer, such that the heating table is located on a side of the silicon wafer opposite to the superconducting material.

10. The method according to claim 1, wherein heating and pressurizing the superconducting material comprises:
heating and pressurizing the superconducting material in a vacuum environment.

11. The method according to claim 1, wherein providing the superconducting material comprises providing the superconducting material comprising at least one of indium or tin.

12. The method of claim 2, wherein the spacer is a hard spacer.

13. The method of claim 2, wherein providing superconducting material on at least one side of the silicon wafer comprising providing the superconducting material at both sides of the silicon wafer, the method further comprises:
providing another spacer, such that the silicon wafer is located between the two spacers.

14. The method of claim 1, wherein providing the superconducting material comprising providing the superconducting material of a diameter of 3 mm.

15. The method of claim 1, wherein providing the superconducting material comprising providing the superconducting material of a diameter greater than that diameter of the silicon via.

16. The method of claim 15, wherein the diameter of the silicon via is between 30 um to 50 μm.

17. The method of claim 1, wherein the silicon via is a through-silicon via or blind silicon via.

18. The method of claim 1, wherein the at least one silicon via is partially through-silicon vias and partially blind silicon vias.

19. A silicon wafer, comprising:
a silicon via; and
superconducting material filled in the silicon via by the method according to claim 1.

* * * * *